(12) United States Patent
Xie et al.

(10) Patent No.: US 9,991,398 B2
(45) Date of Patent: Jun. 5, 2018

(54) THIN FILM TRANSISTOR (TFT) ARRAY SUBSTRATE AND FABRICATION METHOD THEREOF, AND DISPLAY DEVICE

(71) Applicant: BOE TECHNOLOGY GROUP CO., LTD, Beijing (CN)

(72) Inventors: Dini Xie, Beijing (CN); Meili Wang, Beijing (CN); Xianbin Xu, Beijing (CN); Liangchen Yan, Beijing (CN); Xiaojin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/107,094

(22) PCT Filed: Sep. 15, 2015

(86) PCT No.: PCT/CN2015/089658
§ 371 (c)(1),
(2) Date: Jun. 21, 2016

(87) PCT Pub. No.: WO2017/045135
PCT Pub. Date: Mar. 23, 2017

(65) Prior Publication Data
US 2017/0263734 A1  Sep. 14, 2017

(51) Int. Cl.
*H01L 29/786* (2006.01)
*H01L 29/66* (2006.01)
(Continued)

(52) U.S. Cl.
CPC .. *H01L 29/78696* (2013.01); *H01L 21/02565* (2013.01); *H01L 21/02631* (2013.01);
(Continued)

(58) Field of Classification Search
None
See application file for complete search history.

(56) References Cited

U.S. PATENT DOCUMENTS

| 8,012,794 | B2* | 9/2011 | Ye | H01L 21/02521 |
| | | | | 257/43 |
| 2010/0001274 | A1* | 1/2010 | Ye | H01L 21/02521 |
| | | | | 257/57 |

(Continued)

FOREIGN PATENT DOCUMENTS

| CN | 103296087 A | 9/2013 |
| CN | 103515236 A | 1/2014 |

(Continued)

OTHER PUBLICATIONS

Ye, Yan, Rodney Lim, and John M. White. "High Mobility Amorphous Zinc Oxynitride Semiconductor Material for Thin Film Transistors." Journal of Applied Physics 106.7 (2009): 074512.*

(Continued)

*Primary Examiner* — Joseph Schoenholtz
(74) *Attorney, Agent, or Firm* — Anova Law Group, PLLC

(57) ABSTRACT

The present disclosure provides a thin film transistor array substrate and a fabrication method thereof, and a display device. The thin film transistor array substrate includes an active layer. The active layer is formed using a zinc target under an environment of oxygen and nitrogen in a sputtering chamber. A source/drain buffer layer is formed on the active layer using the zinc target by a sputtering process in the sputtering chamber under an environment containing one of oxygen and nitrogen.

17 Claims, 2 Drawing Sheets

(51) Int. Cl.
    H01L 27/12      (2006.01)
    H01L 29/24      (2006.01)
    H01L 21/473     (2006.01)
    H01L 21/02      (2006.01)

(52) U.S. Cl.
    CPC ........ *H01L 21/473* (2013.01); *H01L 27/1225* (2013.01); *H01L 29/24* (2013.01); *H01L 29/66969* (2013.01); *H01L 29/7869* (2013.01); *H01L 29/78618* (2013.01)

(56) References Cited

U.S. PATENT DOCUMENTS

| | | | |
|---|---|---|---|
| 2010/0060839 A1* | 3/2010 | Suzuki | H01L 27/124 349/147 |
| 2012/0138972 A1* | 6/2012 | Li | H01L 29/78633 257/88 |
| 2013/0048994 A1* | 2/2013 | Choi | H01L 29/458 257/59 |
| 2013/0299817 A1 | 11/2013 | Park et al. | |
| 2015/0200212 A1 | 7/2015 | Xue et al. | |
| 2016/0308067 A1* | 10/2016 | Shih | H01L 29/78696 |

FOREIGN PATENT DOCUMENTS

| | | |
|---|---|---|
| CN | 104362180 A | 2/2015 |
| CN | 104779254 A | 7/2015 |

OTHER PUBLICATIONS

Zhang, Shengdong, Ruqi Han, J.K.O. Sin, and Mansun Chan. "A Novel Self-aligned Double-gate TFT Technology." IEEE Electron Device Letters 22.11 (2001): 530-32.*

Park, Jozeph, Yang Soo Kim, Kyung-Chul Ok, Yun Chang Park, Hyun You Kim, Jin-Seong Park, and Hyun-Suk Kim. "A Study on the Electron Transport Properties of ZnON Semiconductors with Respect to the Relative Anion Content." Scientific Reports 6.1 (2016).*

Kim, H.-S. et al. Anion control as a strategy to achieve high-mobility and high-stability oxide thin-film transistors. Sci. Rep. 3, 1459 (2013).*

The World Intellectual Property Organization (WIPO) International Search Report for PCT/CN2015/089658 dated Apr. 29, 2016.

State Intellectual Property Office of the P.R.C (SIPO) Office Action 1 for 201580000894.7 Mar. 16, 2018 17 Pages.

* cited by examiner

THIN FILM TRANSISTOR (TFT) ARRAY SUBSTRATE AND FABRICATION METHOD THEREOF, AND DISPLAY DEVICE

CROSS-REFERENCES TO RELATED APPLICATIONS

The application is a national phase entry under 35 U.S.C. § 371 of International Application No. PCT/CN2015/089658, filed on Sep. 15, 2015, the entire content of which is incorporated herein by reference.

FIELD OF THE DISCLOSURE

The present disclosure generally relates to the field of display technologies and, more particularly, relates to a thin film transistor (TFT) array substrate and a fabrication method thereof, and a display device.

BACKGROUND

Thin film transistor liquid crystal display (TFT-LCD) has the advantages of compact size, low power consumption, and radiation free. Back channel etching (BCE) process is often used for forming TFT based array substrates used in display devices. However, the BCE process requires precise control of the etching process in order to ensure that no source and drain residues remain in an active layer of the TFT to thus protect the active layer during the etching process.

In addition, under BCE structure, metal ions in the source/drain electrodes may diffuse into the active layer, which in turn may adversely affect performance of the thin film transistor liquid crystal display device.

The disclosed TFT array substrates, fabrication methods, and display device are directed to at least partially alleviate one or more problems set forth above and to solve other problems in the art.

BRIEF SUMMARY OF THE DISCLOSURE

One aspect or embodiment of the present disclosure provides a method for forming a thin film transistor (TFT) array substrate. The method includes forming an active layer using a zinc target under an environment of oxygen and nitrogen in a sputtering chamber; and forming a source/drain buffer layer on the active layer using the zinc target by a sputtering process in the sputtering chamber under an environment containing one of oxygen and nitrogen.

Optionally, a source/drain electrode layer is formed on the source/drain buffer layer. A source/drain capping layer is formed on the source/drain electrode layer.

Optionally, the source/drain capping layer is formed using the zinc target under an environment containing one of oxygen and nitrogen.

Optionally, the source/drain capping layer is formed by a material including at least one of a copper-manganese alloy, an indium-zinc oxide, a gallium-zinc oxide, and aluminum-zinc oxide.

Optionally, the active layer, the source/drain buffer layer, and the source/drain capping layer are formed in the same sputtering chamber using the same zinc target.

Optionally, a first insulating layer is formed over the source/drain capping layer and a channel region in the active layer. A through-hole is formed through the insulating layer and through the drain capping layer. A pixel electrode is formed to electrically connect to the drain electrode layer through the through-hole.

Optionally, a gate electrode structure is formed, and a second insulating layer is formed between the gate electrode structure and the active layer.

Optionally, the gate electrode structure is one of a bottom gate structure, a top gate structure, or a double gate structure for forming the array substrate.

Another aspect or embodiment of the present disclosure provides a thin film transistor (TFT) array substrate. The film transistors (TFT) array substrate includes an active layer, and a source/drain buffer layer on and in contact with the active layer. The active layer is made of an oxynitride compound of zinc, and the source/drain buffer layer is made of one of an oxide and a nitride of zinc.

Optionally, a source/drain electrode layer is on the source/drain buffer layer. A source/drain capping layer is on the source/drain electrode layer.

Optionally, the source/drain capping layer is made of an oxide of zinc ($ZnO_x$) or a nitride of zinc ($ZnN_x$).

Optionally, the source/drain buffer layer and the source/drain capping layer are made of a same material.

Optionally, the source/drain capping layer is made of a material including at least one of a copper-manganese alloy, an indium-zinc oxide, a gallium-zinc oxide, and aluminum-zinc oxide.

Optionally, a first insulating layer is over the source/drain capping layer and a channel region in the active layer. A pixel electrode is electrically connected to the drain electrode layer.

Optionally, an insulating layer is between a first gate electrode structure and the active layer.

Optionally, the first gate electrode structure is between a base substrate and a channel region of the active layer.

Optionally, a second gate electrode structure is over the channel region of the active layer.

Optionally, the first gate electrode structure over the channel region of the active layer.

Optionally, the source/drain electrode layer is between a base substrate and the active layer.

Optionally, the source/drain electrode layer is over the active layer.

Another aspect or embodiment of the present disclosure provides a display device, including the disclosed array substrates.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The objectives, features and advantages of the present disclosure may be more fully understood by persons of ordinary skill in the art with reference to the exemplary embodiments which are described in detail below and are illustrated in the accompanying drawings. Wherever possible, the same reference numbers will be used throughout the drawings to refer to the same or like parts.

Figure 1:
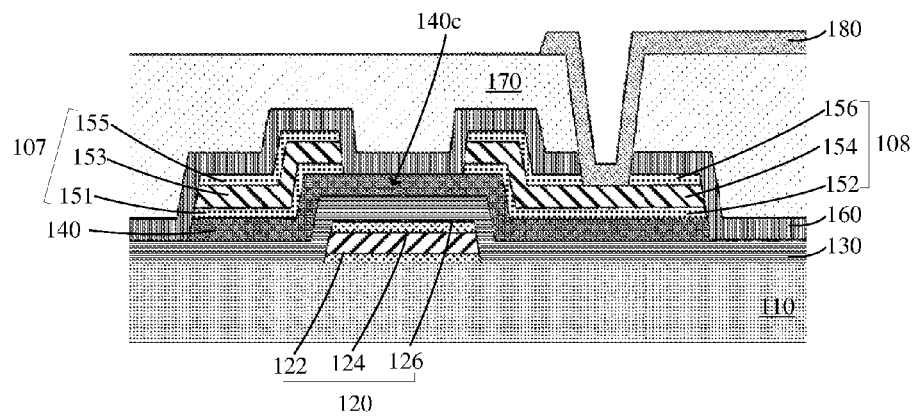
FIG. 1 illustrates a cross sectional structure of an exemplary array substrate according to various embodiments of the present disclosure.

FIG. 1 illustrates a cross sectional structure of an exemplary array substrate according to various embodiments of the present disclosure. In this example, the array substrate may include a bottom gate type TFT.

The exemplary array substrate 100 shown in FIG. 1 may include: a base substrate 110, a gate electrode structure 120, a first insulating layer 130, an active layer 140, a source electrode structure 107, a drain electrode structure 108, a second insulating layer 160, a third insulating layer 170, and a pixel electrode 180. Certain layers/components may be omitted and other layers/components may be included.

The base substrate 110 may be an optically transparent substrate. For example, the base substrate 110 may be made of glass, quartz, and/or plastic. The base substrate 110 may be, for example, a flexible substrate, made of a polymer.

The gate electrode structure 120 may be formed over a surface portion of the base substrate 110. The gate electrode structure 120 may include a gate buffer layer 122, a gate electrode layer 124, and a gate capping layer 126. The gate electrode layer 124 may be sandwiched between the gate buffer layer 122 and the gate capping layer 126. The gate capping layer 126 may be on top of the gate electrode layer 124. The gate buffer layer 122 may have a thickness of about 100 nm or less, for example, about 20 nm to about 100 nm.

Each of the gate buffer layer 122, the gate electrode layer 124, and the gate capping layer 126 may be made of same or different electrically conductive materials. Non-limiting examples of the electrically conductive materials may include: metal material and/or transparent conductive material. The metal material may include aluminum (Al), copper (Cu), molybdenum (Mo), titanium (Ti), nickel (Ni), tungsten (W), gold (Au), palladium (Pd), platinum (Pt), chromium (Cr), neodymium (Nd), zinc (Zn), cobalt (Co), manganese (Mn), and any mixtures or alloys thereof. The transparent conductive material may include, for example, an indium tin oxide (ITO), an indium zinc oxide (IZO), and an aluminum doped zinc oxide (AZO).

The combination of the gate buffer layer 122, the gate electrode layer 124, and the gate capping layer 126 may provide layers with different physical properties. For example, the gate electrode layer 124 may be made of metal copper, the gate buffer layer 122 may facilitate/provide adhesion between the gate electrode layer 124 and the underlying layer such as the base substrate 110, as shown in FIG. 1. The gate capping layer 126 may be used as a diffusion barrier layer to prevent diffusion of copper ions from the gate electrode layer 124.

In various embodiments, the gate buffer layer and the gate capping layer may be optional and may be omitted.

The first insulating layer 130 may be formed over the gate electrode structure 120 and over surface portions of the base substrate 110. The first insulating layer 130 may be a gate insulating layer. The first insulating layer 130 may be made of an insulating material such as, for example, silicon nitride ($SiN_x$), silicon oxide ($SiO_x$), silicon oxynitride ($SiO_xN_y$), aluminum oxide ($AlO_x$), yttrium oxide ($Y_2O_3$), hafnium oxide ($HfO_x$), zirconium oxide ($ZrO_x$), aluminum nitride (AlN), aluminum oxynitride (AlNO), titanium oxide ($TiO_x$), barium titanate ($BaTiO_3$), lead titanate ($PbTiO_3$), or a combination thereof.

The active layer 140 may be formed at least over the gate electrode structure 120. The active layer 140 may include a portion used as a channel region 140c positioned above the gate electrode structure 120 and between subsequently formed source and drain electrode structures. As disclosed herein, the active layer 140 may be made of an oxynitride material such as ZnON.

The source electrode structure 107 and the drain electrode structure 108 may be formed over both sides of the active layer 140 to expose the channel region 140c in the active layer 140. In other words, the channel region 140c may be a portion of the active layer 140 that is between the source electrode structure 107 and the drain electrode structure 108.

The source electrode structure 107 may include a source buffer layer 151, a source electrode layer 153, and a source capping layer 155. The drain electrode structure 108 may include a drain buffer layer 152, a drain electrode 154, and a drain capping layer 156.

Each of the source electrode layer 153 and the drain electrode 154 may be a main wiring layer, for example, made of an electrical conductive layer such as copper, a copper alloy, or other suitable electrode material. As disclosed, each of the source buffer layer 151 and the drain buffer layer 152 may be made of a $ZnO_x$ material or a $ZnN_x$ material.

In some embodiments, each of the source capping layer 155 and the drain capping layer 156, also referred to as S/D capping layers 155/156, may be made of, for example, a copper alloy such as a copper-manganese alloy and/or a metal oxide such as indium-zinc oxide, gallium-zinc oxide, and aluminum-zinc oxide.

In other embodiments, the S/D capping layers 155/156 may be made of $ZnO_x$ or $ZnN_x$, while the S/D buffer layers 151/152 are made of $ZnO_x$ or $ZnN_x$. In one embodiment, all of the source buffer layer 151, the source capping layer 155, the drain buffer layer 152, and the drain capping layer 156 may be made of the same material.

Alternatively, in an exemplary embodiment, the S/D capping layers 155/156 may be omitted, such that the source electrode structure 107 and the drain electrode structure 108 may be formed as, for example, a double-layer structure including a buffer layer (151 or 152) and a main wiring electrode layer (153 or 154) on the buffer layer.

As such, one gate electrode structure 120, one source electrode structure 107, and one drain electrode structure 108 may form one thin film transistor (TFT) including the channel region 140c of the active layer 140. The channel region 140c of the thin film transistor is formed in a region of the active layer 140 between the source electrode structure 107 and the drain electrode structure 108.

As disclosed, the active layer 140 of the formed thin film transistor (TFT) may be made of ZnON, while the S/D buffer layers 151/152 formed between the active layer 140 and the S/D electrode layer 153/154 may be made of $ZnO_x$ or $ZnN_x$. The active layer 140 and the S/D buffer layers 151/152, and sometimes the S/D capping layer may thus be formed in a same reaction chamber using a same metal target Zn. Manufacturing process and cost may thus be simplified.

For example, after forming ZnON active layer 140 by using Zn as metal target in an environment containing oxygen and nitrogen, $ZnO_x$ or $ZnN_x$ S/D buffer layers may then be formed either simultaneously or separately, on the ZnON active layer 140 using the same Zn metal target in a same sputtering chamber in environment containing either oxygen or nitrogen.

In various embodiments, the S/D buffer layers 151/152 made of $ZnO_x$ or $ZnN_x$ may be used as a diffusion barrier layer such that exemplary metals such as copper in the S/D electrode layers 153/154 may not he diffused into the active layer 140.

In various embodiments, each of the S/D buffer layers 151/152 may be formed having a thickness of about 100 nm or less, for example, in a range between 20 nm and 100 nm. The thickness of the S/D buffer layers 151/152 may be critical for the resultant TFT. For example, when the S/D buffer layers 151/152 are formed overly thick, electrical performance of the resultant TFT may be adversely affected. When the S/D buffer layers 151/152 are formed overly thin, function of the S/D buffer layers 151/152 may be adversely affected. For example, overly-thin S/D buffer layers may not be able to provide sufficient adhesion between the S/D electrode layers 153/154 and the actively layer 140.

The second insulating layer 160 may also be referred to as a passivation layer and may be formed over the channel region 140c in the active layer 140, the source electrode structure 107, the drain electrode structure 108, and/or surface portions of the first insulating layer 130 that are not covered by the active layer 140.

The third insulating layer 170 may be formed over the second insulating layer 160. The third insulating layer 170 may be located between the second insulating layer 160 and the pixel electrode 180.

Each of the second/third insulating layers 160/170 may be made of, for example, an inorganic insulator such as silicon nitride or silicon oxide, an organic insulator, and a low dielectric ratio insulator. For example, each of the second/third insulating layers 160/170 may be formed of an organic insulator such as polyimide, polyamide, acrylic resin, epoxy resin, cyclo-olefin resin, or benzocyclobutene (BCB).

In one certain embodiment, the second insulating layer 160 may be formed of silicon oxide, and the third insulating layer 170 may be formed of silicon nitride. In some cases, the second insulating layer 160 may be optional or omitted.

The pixel electrode 180 may be formed over a surface of the third insulating layer 170 and may be connected to the drain electrode 154 by a through-hole formed through the second and third insulating layers 160 and 170 and the drain capping layer 156. For example, the through-hole (not shown in FIG. 1) may be formed through the second and third insulating layers 160 and 170 and the drain capping layer 156 to expose a surface portion of the drain electrode layer 154. Electrical conductive materials may be formed on the exposed drain electrode layer 154 and on sidewall of through-hole in the insulating layers 160 and 170 and the drain capping layer 156 to form the pixel electrode 180. The pixel electrode 180 may thus be physically and electrically connected to the drain electrode layer 154 of the thin film transistor through such through-hole.

The pixel electrode 180 may be made of a transparent conductive material such as, for example, indium tin oxide (ITO), indium zinc oxide (IZO), aluminum zinc oxide (AZO), cadmium tin oxide (CTO), or a reflective conductive material such as, for example, aluminum (Al), gold (Au), silver (Ag), copper (Cu), iron (Fe), titanium (Ti), tantalum (Ta), molybdenum (Mo), rubidium (Rb), tungsten (W), and alloys, or combinations thereof. In addition, the pixel electrode 180 may be formed of, for example, transflective materials or a combination of transparent materials and reflective materials.

Figure 2:
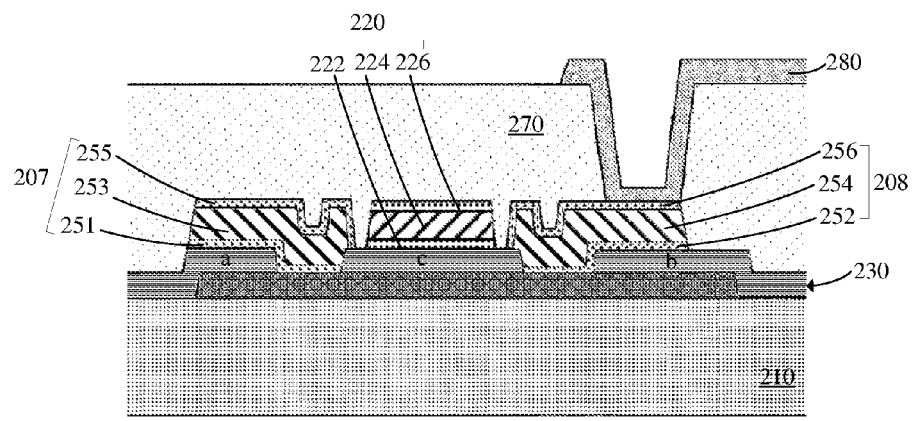
FIG. 2 illustrates a cross sectional structure of another exemplary array substrate according to various embodiments of the present disclosure.

FIG. 2 illustrates a cross sectional structure of another exemplary array substrate according to various embodiments of the present disclosure. Compared with the exemplary array substrate 100 in FIG. 1 including a bottom gate type TFT, the exemplary array substrate 200 in FIG. 2 may include a top gate type TFT.

The exemplary array substrate 200 shown in FIG. 2 may include: a base substrate 210, a gate electrode structure 220 including a gate buffer layer 222, a gate electrode layer 224, and a gate capping layer 226, a first insulating layer 230, an active layer 240, a source electrode structure 207 including a source buffer layer 251, a source electrode 253, and a source capping layer 255, a drain electrode structure 208 including a drain buffer layer 252, a drain electrode 254, and a drain capping layer 256, a second insulating layer 270, and a pixel electrode 280.

Certain layers/components in FIG. 2 may be omitted and other layers/components may be included. In various embodiments, each layer/component in FIG. 2 may be formed the same or similar to the corresponding layer/component as described in FIG. 1.

For example, the active layer 240 may be formed over the base substrate 210. The first insulating layer 230 may be patterned over the active layer 240 and the base substrate 210.

As shown, the first insulating layer 230 may include patterned insulating layers 230a, 230b, and 230c. The patterned insulating layer 230a may be formed partially over one end of the active layer 240 and partially over the base substrate 210. The patterned insulating layer 230b may be formed partially over the other end of the active layer 240 and partially over a corresponding surface of the base substrate 210. The patterned insulating layer 230c may be formed substantially on the active layer 240 and positioned between the patterned insulating layers 230a-b.

The source electrode structure 207 may be formed at least partially over the patterned insulating layers 230a and 230c and over the active layer 240 between the patterned insulating layers 230a and 230c. The gate electrode structure 220 may be formed over the patterned insulating layers 230c.

The drain electrode structure 208 may be formed at least partially over the patterned insulating layers 230b and 230c and over the active layer 240 between the patterned insulating layers 230b and 230c.

The second insulating layer 270 may be formed over the source electrode structure 207, the gate electrode structure 220, the drain electrode structure 208, and/or exposed surface portions of the first insulating layer 230, as shown in FIG. 2.

The pixel electrode 280 may be formed over a surface of the second insulating layer 270 and may be connected to the drain electrode 254 by a through-hole formed through the second insulating layer 270 and the drain capping layer 256. For example, the through-hole (not shown in FIG. 2) may be formed through the second insulating layer 270 and the drain capping layer 256 to expose a surface portion of the drain electrode layer 254. Electrical conductive materials may be formed on the exposed drain electrode layer 254 and on sidewall of through-hole in the insulating layer 270 and the drain capping layer 256 to form the pixel electrode 280. The pixel electrode 280 may thus be physically and electrically connected to the drain electrode layer 254 of the thin film transistor through such through-hole.

Figure 3:
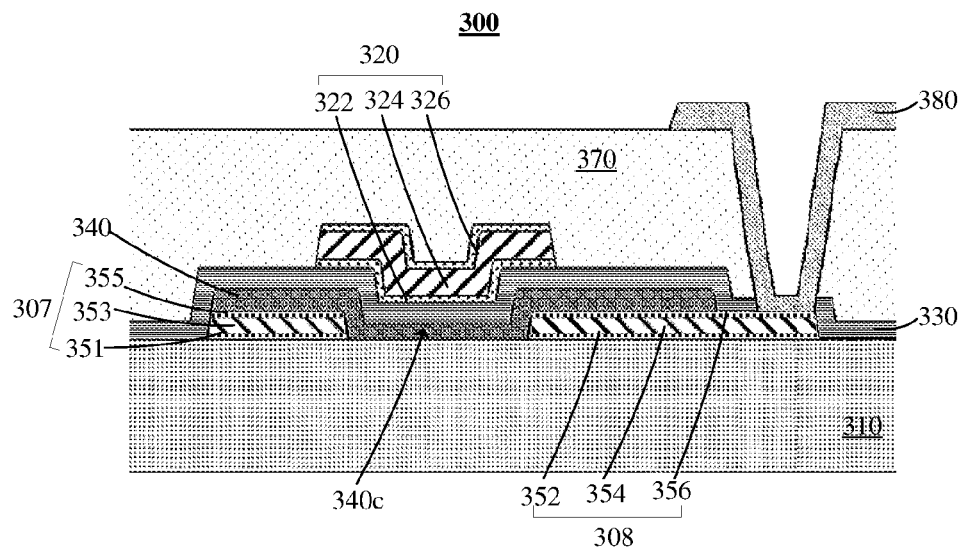
FIG. 3 illustrates a cross sectional structure of another exemplary array substrate according to various embodiments of the present disclosure.

FIG. 3 illustrates a cross sectional structure of another exemplary array substrate 300 according to various embodiments of the present disclosure. Compared with the exemplary array substrate 100 in FIG. 1 including a bottom gate type TFT and compared with the exemplary array substrate 200 in FIG. 2 including a top gate type TFT, the exemplary array substrate 300 may include another top gate type TFT.

The exemplary array substrate 300 shown in FIG. 3 may include: a base substrate 310, a gate electrode structure 320 including a gate buffer layer 322, a gate electrode layer 324, and a gate capping layer 326, a first insulating layer 330, an active layer 340, a source electrode structure 307 including a source buffer layer 351, a source electrode 353, and a source capping layer 355, a drain electrode structure 308 including a drain buffer layer 352, a drain electrode 354, and a drain capping layer 356, a second insulating layer 370, and a pixel electrode 380.

Certain layers/components in FIG. 3 may be omitted and other layers/components may be included. In various embodiments, each layer/component in FIG. 3 may be formed the same or similar to the corresponding layer/component as described in FIG. 1 and FIG. 2.

For example, the source electrode structure 307 may be formed over a first surface portion of the base substrate 310. The drain electrode structure 308 may be formed over a second surface portion of the base substrate 310.

The active layer 340 may be formed over a third portion of the base substrate 310 between the source electrode structure 307 and drain electrode structure 308 and on the surface of each of the source electrode structure 307 and drain electrode structure 308. The portion of the active layer 340 over the third portion of the base substrate 310 between the source and drain (S/D) electrode structures 307/308 may include a channel region 340c.

The first insulating layer 330 may be formed over the active layer 340, over the exposed the source and drain electrode structures 307/308, and over surface portions of the base substrate 310, as shown in FIG. 3.

The gate electrode structure 320 may be formed over a portion of the first insulating layer 330 to at least cover the underlying channel region 340c.

The second insulating layer 370 may be formed over the gate electrode structure 320 and the exposed surface portions of the first insulating layer 230.

The pixel electrode 380 may be formed over a surface of the second insulating layer 370 and may be connected to the drain electrode layer 354 by a through-hole formed through the second insulating layer 370 and the drain capping layer 356. For example, the through-hole (not shown in FIG. 3) may be formed through the second insulating layer 370 and the drain capping layer 356 to expose a surface portion of the drain electrode layer 354. Electrical conductive materials may then be formed on the exposed drain electrode layer 354 and on sidewall of through-hole in the insulating layer 370 and the drain capping layer 356 to form the pixel electrode 380. The pixel electrode 380 may thus be physically and electrically connected to the drain electrode layer 354 of the thin film transistor through such through-hole.

Figure 4:
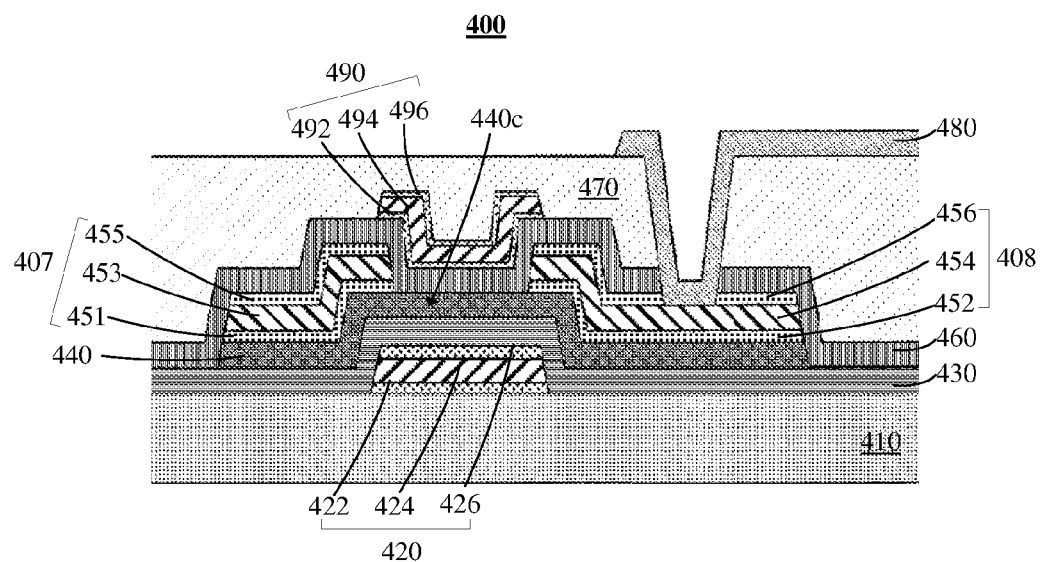
FIG. 4 illustrates a cross sectional structure of another exemplary array substrate according to various embodiments of the present disclosure.

FIG. 4 illustrates a cross sectional structure of another exemplary array substrate according to various embodiments of the present disclosure. As shown, the exemplary array substrate may include a double gate type TFT.

Compared with the exemplary array substrate 100 in FIG. 1 including a bottom gate type TFT, the exemplary array substrate 400 may further include a top gate type TFT to form a double gate type TFT.

As similarly shown in FIG. 1, the array substrate 400 may include a bottom gate structure including a base substrate 410, a gate electrode structure 420 including a gate buffer layer 422, a gate electrode layer 424, and a gate capping layer 426, a first insulating layer 430, an active layer 440, a source electrode structure 407 including a source buffer layer 451, a source electrode layer 453, and a source capping layer 455, a drain electrode structure 408 including a drain buffer layer 452, a drain electrode layer 454, and a drain capping layer 456, a second insulating layer 460, a third insulating layer 470, and a pixel electrode 480.

Further, the array substrate 400 may include a top gate structure. For example, a second gate electrode structure 490 including a gate buffer layer 492, a gate electrode layer 494, and a gate capping layer 496 may be added and formed over the channel region 440c of the active layer 440, as shown in FIG. 4.

In various embodiments, each layer/component in FIG. 4 may be formed the same or similar to the corresponding layer/component as described in FIGS. 1-3.

As such, in a certain embodiment, the source buffer layer and the drain buffer layer may be formed on the active layer, using a same metal target in a same sputtering chamber as for the active layer, under an environment containing either oxygen or nitrogen. In other words, the source buffer layer and the drain buffer layer may be formed simultaneously in a single, same process using a same material. In various embodiments, the source buffer layer and the drain buffer layer may be referred to as a source/drain buffer layer.

In addition, the source electrode layer and the drain electrode layer may be simultaneously, respectively formed on the source buffer layer and the drain buffer layer in a single, same process using a same material. In various embodiments, the source electrode layer and the drain electrode layer may be referred to as a source/drain electrode layer.

Further, the source capping layer and the drain capping layer may be formed respectively on the source electrode layer and the drain electrode layer, using a same metal target in a same sputtering chamber as for the active layer, under an environment containing either oxygen or nitrogen. In other words, the source capping layer and the drain capping layer may be formed simultaneously in a single, same process using a same material. In various embodiments, the source capping layer and the drain capping layer may be referred to as a source/drain capping layer.

Various embodiments further include a display device. The display device may include the disclosed array substrates, for example, as shown in FIGS. 1-4. The disclosed display device may be used in a liquid crystal display (LCD) device, an organic light emitting diode (OLED) display device, an electronic paper, a mobile phone, a tablet computer, a television, a monitor, a laptop, a digital photo frame, a navigation system, and/or other products with display function.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:
1. A method for forming a thin film transistor (TFT) array substrate, comprising:
    forming an active layer using a zinc target under an environment of oxygen and nitrogen in a sputtering chamber;

forming a source/drain buffer layer on the active layer using the zinc target by a sputtering process in the sputtering chamber under an environment containing one of oxygen and nitrogen;

forming a source/drain electrode layer on the source/drain buffer layer; and forming a source/drain capping layer on the source/drain electrode layer using the zinc target under an environment containing one of the oxygen and nitrogen.

2. The method according to claim 1, further including:
forming the source/drain capping layer by a material including at least one of an indium-zinc oxide, a gallium-zinc oxide, or aluminum-zinc oxide.

3. The method according to claim 1, wherein:
the active layer, the source/drain buffer layer, and the source/drain capping layer are formed in the same sputtering chamber using the same zinc target.

4. The method according to claim 1, further including:
forming a first insulating layer over the source/drain capping layer and a channel region in the active layer;
forming a through-hole through the first insulating layer and through the drain capping layer, and
forming a pixel electrode to electrically connect to the drain electrode layer through the through-hole.

5. The method according to claim 1, further including:
forming a gate electrode structure, and
forming a second insulating layer between the gate electrode structure and the active layer.

6. The method according to claim 5, wherein:
the gate electrode structure is one of a bottom gate structure, a top gate structure, and a double gate structure for forming the array substrate.

7. A thin film transistor (TFT) array substrate, comprising:
an active layer;
a source/drain buffer layer on and in contact with the active layer,
a source/drain electrode layer on the source/drain buffer layer; and
a source/drain capping layer on the source/drain electrode layer,
wherein the active layer is made of an oxynitride compound of zinc, the source/drain buffer layer is made of one of an oxide and a nitride of zinc, and the source/drain capping layer is made of an oxide of zinc or a nitride of zinc.

8. The array substrate according to claim 7, wherein:
the source/drain buffer layer and the source/drain capping layer are made of a same material.

9. The array substrate according to claim 7, wherein:
the source/drain capping layer is made of a material including at least one of an indium-zinc oxide, a gallium-zinc oxide, or aluminum-zinc oxide.

10. The array substrate according to claim 7, further including:
a first insulating layer over the source/drain capping layer and a channel region in the active layer, and
a pixel electrode electrically connecting to the drain electrode layer through a through-hole.

11. The array substrate according to claim 7, further including:
a first gate electrode structure, wherein:
a second insulating layer is between the first gate electrode structure and the active layer.

12. The array substrate according to claim 11, wherein:
the first gate electrode structure is between a base substrate and a channel region of the active layer.

13. The array substrate according to claim 12, further including:
a second gate electrode structure is over the channel region of the active layer.

14. The array substrate according to claim 11, wherein:
the first gate electrode structure is over the channel region of the active layer, and
the source/drain electrode layer is between a base substrate and the active layer.

15. The array substrate according to claim 11, wherein:
the first gate electrode structure is over the channel region of the active layer, and
the source/drain electrode layer is over the active layer.

16. A display device, comprising the array substrate of claim 7.

17. A method for forming a thin film transistor (TFT) array substrate, comprising:
forming an active layer using a zinc target under an environment of oxygen and nitrogen in a sputtering chamber;
forming a source/drain buffer layer on the active layer using the zinc target by a sputtering process in the sputtering chamber under an environment containing one of oxygen and nitrogen;
forming a source/drain electrode layer on the source/drain buffer layer; and
forming a source/drain capping layer on the source/drain electrode layer,
wherein the active layer, the source/drain buffer layer, and the source/drain capping layer are formed in the same sputtering chamber using the same zinc target.

* * * * *